United States Patent [19]

Matsuda et al.

[11] Patent Number: 5,757,078
[45] Date of Patent: May 26, 1998

[54] SEMICONDUCTOR DEVICE WITH INCREASED MULTI-BUMPS AND ADHERED MULTILAYERED INSULATING FILMS AND METHOD FOR INSTALLING SAME

[75] Inventors: Shuichi Matsuda; Kazutaka Shoji, both of Tokyo, Japan

[73] Assignee: NEC Corporation, Tokyo, Japan

[21] Appl. No.: 637,281

[22] Filed: Apr. 24, 1996

[30] Foreign Application Priority Data

Apr. 27, 1995 [JP] Japan ................. 7-103812

[51] Int. Cl.$^6$ ................. H01L 23/48
[52] U.S. Cl. ................. 257/737; 257/738; 257/774; 257/778; 257/780
[58] Field of Search ................. 257/734, 737, 257/738, 774, 778, 779, 780

[56] References Cited

U.S. PATENT DOCUMENTS 5,289,346  2/1994  Carey et al. ................. 257/778
5,407,864  4/1995  Kim ................. 257/778
5,510,758  4/1996  Fujita et al. ................. 257/778

FOREIGN PATENT DOCUMENTS 3-135093  6/1991  Japan.
4-118958  4/1992  Japan.
7-321157  12/1995  Japan.

Primary Examiner—Carl W. Whitehead
Attorney, Agent, or Firm—Sughrue, Mion, Zinn, Macpeak & Seas, PLLC

[57] ABSTRACT

A semiconductor device including a semiconductor chip having electrode pads, a package composed of a plurality of insulating films and adhered to the semiconductor chip by an adhesive agent. The package includes wiring patterns interposed between the plurality of insulating films, and the wiring patterns are selectively connected to the electrode pads at one end, and to the plurality of electrically conductive protrusions at the other end, via viaholes. The semiconductor device further includes a plurality of electrically conductive protrusions extending from the outermost wiring patterns via the viaholes provided in the outermost insulating film.

16 Claims, 6 Drawing Sheets

SEMICONDUCTOR DEVICE WITH INCREASED MULTI-BUMPS AND ADHERED MULTILAYERED INSULATING FILMS AND METHOD FOR INSTALLING SAME

BACKGROUND OF THE INVENTION

1. Field of the Invention

The invention relates to a semiconductor device and, more particularly, to a semiconductor device including a semiconductor chip and a package that has a size substantially equal to one surface of the semiconductor chip, and a method for installing such a semiconductor device on a printed circuit board.

2. Description of Related Art

Conventionally, there are known various semiconductor packages as shown in Japanese Laid Open Patent Disclosures (JP-A-Hei4-118958 and JP-A-Hei3-135093). In the reference (JP-A-Hei4-118958), an I/O lead connection region and an outer lead bonding region ate made as a unitary in a separatable manner. In the reference (JP-A-Hei3-135093), substrates with a hole are provided to allow an electric part to be connected to wiring patterns on the substrates without throughholes.

Further, as shown in Japanese Laid Open Patent Disclosure (JP-A-Hei7-321157), a semiconductor package has a size that is substantially similar to a semiconductor chip is mounted and installed on the package to construct a semiconductor device. More particularly, in the semiconductor device having the semiconductor package, an insulating film formed of polyimide or the like as the semiconductor package is adhered to the surface of the semiconductor chip excluding electrode pads of the semiconductor chip, by an adhesive agent, and electrically conductive projections (hereinafter, called "bumps") are provided for wirings formed on the insulating film such that the conductive projections are connected to electrode pads of the semiconductor chip. The wirings on the insulating film are coated by a cover coating. The bumps are arranged in a matrix manner onto the wirings of the insulating film in such a form that they are protruded from the cover coating.

The semiconductor device using the semiconductor package of such a structure has the advantage that a number of semiconductor devices can be installed on a board of a small area because the semiconductor package has the same size as that of the semiconductor chip.

Even in a semiconductor device having a semiconductor package, it is predicted in the future to have a large number of pins (hereinafter, referred to as "multi-pins") by increasing the number of electrode pads on the semiconductor chip. In order to cope with the increase in the number of electrode pads, it is necessary to increase the number of bumps and to reduce a size of bump as small as possible. It also requires making the wiring patterns fine of the insulating film to be connected to the electrode pad portions on the semiconductor chip. When the size of bump is miniaturized for the purpose of multi-pins, it is also predicted that a bonding intensity between the bump and a land which is provided on the insulating film decreases and that noises are generated due to the realization of the fine wiring patterns.

Further, when a semiconductor device in a state in which the bumps are protruded on the semiconductor package, the surface of the bump is naturally oxidized, so that a natural oxide film is formed on the surface. An electrical test, namely, a conduction test, is generally executed by making a probe come into contact with each bump for testing normality of the wirings, in a state in which the natural oxide film is formed as mentioned above. With respect to the electrical test, it is necessary to break the natural oxide film formed on each bump by the probe. When the size of the bump decreases, however, it is difficult to make the probe come into contact with each bump, so that it is difficult to accurately perform the electrical test. When the probe strongly come into contact with the small bump with a force larger than needed in order to accurately perform the electrical test, a problem is caused is that the bump is largely deformed.

Further, in case of installing the semiconductor device having the semiconductor package onto the printed circuit board, the bump is reflowed and joined to a conductor layer on the printed circuit board. As the size of bump decreases, the possibility increases that the bump is broken in the bonding portion with the land on the insulating film due to a difference of coefficients of thermal expansion between the board and the insulating film in a heat cycle test executed after the reflow, and in practical use as a product.

In addition, in a case where the semiconductor device in which the bump is projected is installed onto the board, in order to enhance a bonding intensity between the semiconductor device and the board after completion of the installation, an adhesive resin is injected into a gap between the installed semiconductor device and the board and the periphery of the bump is surrounded by the adhesive resin. However, in this case, even if a defect or abnormality of the semiconductor chip is detected after the adhesive resin was injected, it is impossible to replace only the semiconductor chip in which the defect or abnormality was detected.

SUMMARY OF THE INVENTION

In a semiconductor device having a semiconductor package, it is an object of the invention to provide a semiconductor package which can cope with an increase in the number of bumps and can solve the foregoing various problems in association with the realization of a number of bumps (hereinafter, referred to as "multi-bumps") and to also provide a semiconductor device having such a semiconductor package and an installing structure of the semiconductor device.

Another object of the invention is to provide a probe apparatus which can accurately perform an electrical test without deforming a bump even if the bump is miniaturized.

Still another object of the invention is to provide a semiconductor device which does not cause breaking or the like of a bump for the period of time of a temperature cycle test which is executed after a reflow and for a time interval during which the semiconductor device is actually used as a product, even if a semiconductor package of a fine size is used.

Further, another object of the invention is to provide an installing method of a semiconductor device, whereby even after the semiconductor device was installed on a board or the like and an adhesive resin was injected, a semiconductor chip can be exchanged.

In order to achieve an aspect of the present invention, a semiconductor device includes a semiconductor chip having electrode pads, a package composed of a plurality of insulating films and adhered to the semiconductor chip by an adhesive agent. The package includes wiring patterns interposed between the plurality of insulating films, and wiring patterns are selectively connected to the electrode pads and/or the other of the wiring patterns via viaholes provided in the plurality of insulating films in accordance with the utility of the semiconductor chip. The semiconductor device further includes a plurality of electrically conductive protrusions extending from the outermost wiring patterns via the viaholes provided in the outermost insulating film.

The package has substantially the same area as the semiconductor chip and the wiring pattern includes a ground line wiring pattern extending overall other than the wiring patterns between adjacent two of the plurality of insulating films. The plurality of conductive protrusions may extend from extended land portions disposed on the outermost insulating film. In this case, each of the extended land portions is greater in area than the viahole provided in the outermost insulating film and may have a semi-spherical shape.

The semiconductor device may further include a resin layer surrounding the plurality of conductive protrusions and covering the outermost insulating film so that the conductive protrusions can be protected. If the resin layer has an adhesive property, the semiconductor device can be adhered to another substrate. Also, if a material of the resin layer has a melting point equal to or higher than that of the plurality of conductive protrusions, the semiconductor device can be easily installed and replaced.

In order to achieve another aspect of the present invention, a method of manufacturing an apparatus using a semiconductor device, includes the steps of:

providing a semiconductor chip having electrode pads and a package composed of a plurality of insulating films, wherein the package includes wiring patterns interposed between the plurality of insulating films, the wiring patterns are selectively connected to the electrode pads and/or the other of the wiring patterns via viaholes provided in the plurality of insulating films in accordance with the utility of the semiconductor chip;

adhering the package to the semiconductor chip by an adhesive agent;

forming a plurality of electrically conductive protrusions extending from the outermost wiring patterns via the viaholes provided in the outermost insulating film to manufacture a semiconductor device.

In still another aspect of the present invention, a semiconductor device includes a semiconductor chip having electrode pads, a package composed of a plurality of insulating films and adhered to the semiconductor chip by an adhesive agent, wherein the package includes wiring patterns interposed between the plurality of insulating films and extended land portions disposed on the outermost insulating film, and the wiring patterns are selectively connected to the electrode pads and/or the other of the wiring patterns via viaholes provided in the plurality of insulating films in accordance with the utility of the semiconductor chip, and a plurality of electrically conductive protrusions extending from the outermost wiring patterns via the viaholes provided in the outermost insulating film.

DESCRIPTION OF THE PREFERRED EMBODIMENTS

The semiconductor device, mounting and testing of the semiconductor device of the present invention will now be described below with reference to the accompanying drawings.

Figure 1:
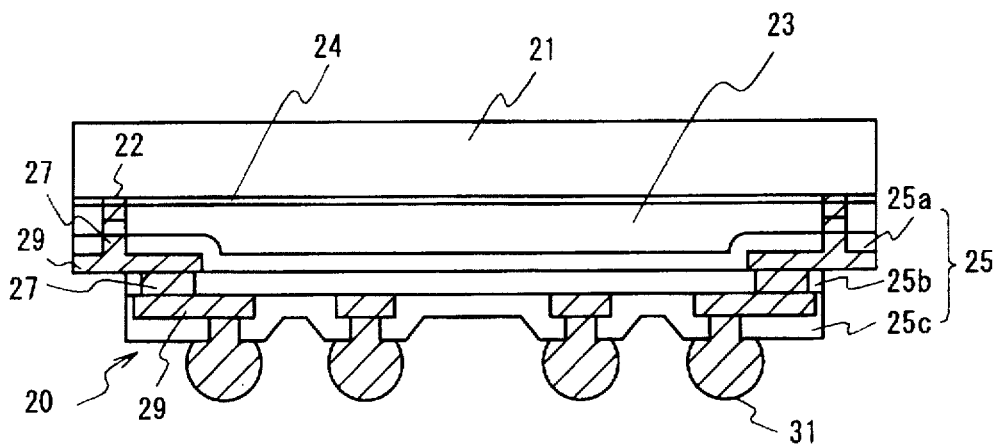
FIG. 1 is a cross sectional view which is used for explaining a schematic construction of a semiconductor device in which a semiconductor chip is mounted on a semiconductor package, according to a first embodiment of the present invention.

FIG. 1 is a cross sectional view of a semiconductor package 20 according to the first embodiment of the present invention. Referring to FIG. 1, a semiconductor package 20 has an area that is substantially the same as a surface of a semiconductor chip 21 and is adhered onto the surface of the semiconductor chip 21 and is used. In an example shown in the figure, a plurality of electrode pads 22 are provided on the surface of the semiconductor chip 21 and the surface other than the electrode pads 22 is covered by an insulating film 24. The semiconductor package 20 is adhered to the semiconductor chip 21 by an adhesive agent such that the surface of the semiconductor chip 21 other than the electrode pads 22 is covered by the adhesive agent layer 23.

The semiconductor package 20 shown in the figure has an insulating film layer 25 of polyimide. The insulating film layer 25 is formed of a plurality of insulating film layers (three layers 25a, 25b, and 25c in the embodiment). Viaholes 27 are formed in each of the insulating films 25a to 25c and wiring patterns 29 are formed on both surfaces of the insulating film 25b. The wiring patterns 29 can be classified into viahole wiring patterns, ground line wiring patterns, signal line wiring patterns, and power supply line wiring patterns. Among them, the ground line wiring patterns and power supply line wiring patterns are electrically connected to the plurality of electrode pads 22 of the semiconductor chip 21. However, the ground line wiring patterns and power supply line wiring patterns can be finally collectively constructed as two common wiring patterns, respectively.

In the example shown in the figure, the wiring patterns 29 are formed between the insulating film 25a as the first insulating layer, and the insulating film 25b as the second insulating layer 25b. The wiring patterns 29 are electrically connected to the electrode pads 22 on the semiconductor chip 21 through the viahole wiring patterns, respectively. Further, the wiring patterns 29 are formed between the insulating film 25b and the insulating film 25c as the third insulating layer. The wiring pattern 29 between the second and third insulating films 25b and 25c are connected to the wiring patterns 29 between the first and second insulating film 25a and 25b via the viahole wiring patterns provided in the second insulating film 25b. Conductive projections, namely, bumps 31 are formed on the third insulating film 25c as an outermost layer of the insulating film layer 25 and electrically connected to the wiring patterns 29 between the second and third insulating films 25b and 25c. The bumps 31 are directly bonded onto a printed circuit board (not shown) or the like and a desired semiconductor device can be constructed.

As the number of electrode pads 22 on the semiconductor chip 21 increases, the number of bumps 31 also needs to be increased in association with it. However, it is necessary to arrange the bumps 31 with a certain distance between the bumps, for example, 500 μm in conjunction with the connection with the board. It is, therefore, desirable to reduce the number of bumps as compared with the number of electrode pads. In the embodiment, by constructing the insulating film 25 as a multi-layer structure, the number of bumps 31 can be reduced as compared with the number of electrode pads 22.

Figure 2:
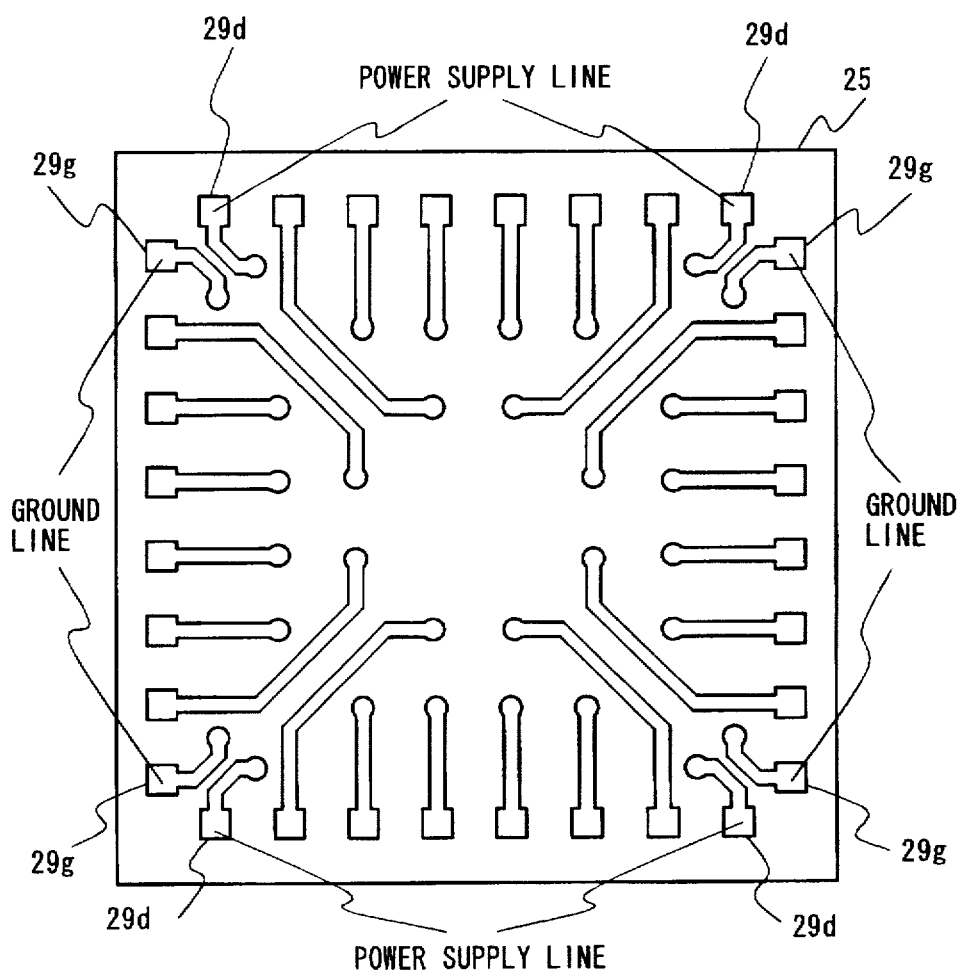
FIG. 2 is a plan view of an insulating film used in the first embodiment of the present invention shown in FIG. 1.
Figure 3:
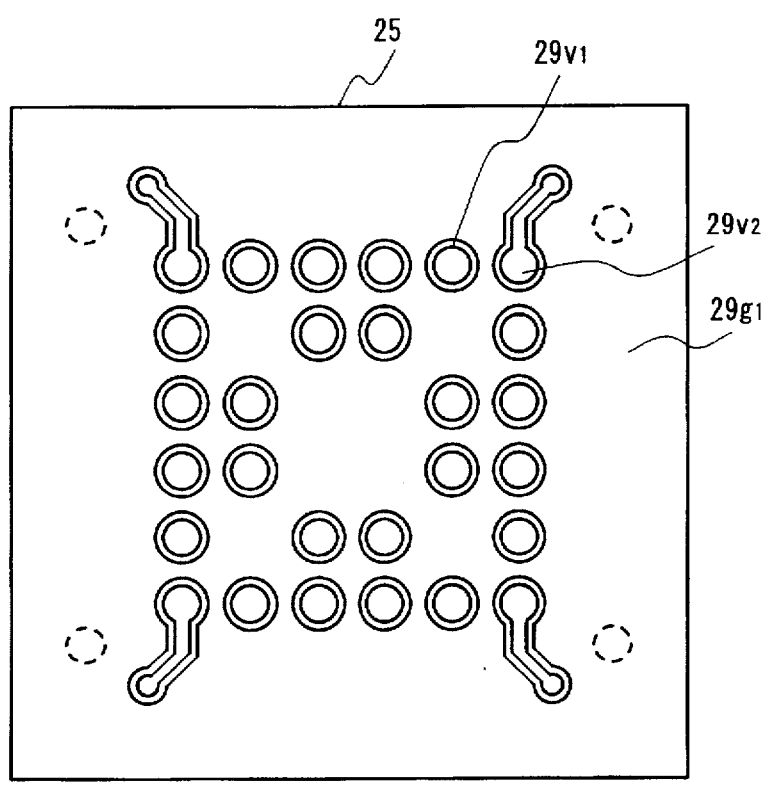
FIG. 3 is a plan view of an opposing surface of the insulating film shown in FIG. 2.

FIGS. 2 and 3 are plan views for further specifically explaining the embodiment of FIG. 1. FIG. 2 shows the wiring patterns between the first and second insulating film 25a and 25b. FIG. 3 shows the wiring patterns between the second and third insulating films 25b and 25c. Referring to FIG. 2, four ground line wiring patterns 29g are included in the wiring patterns between the first and second insulating films 25a and 25b. Each ground line wiring 29g is terminated by a ground electrode pad which is connected to the semiconductor chip 21. Four power supply line wiring patterns 29d are provided in the figure. The power supply line wiring patterns 29d are terminated by power supply line electrode pads which are connected to the semiconductor chip 21. The remaining wiring patterns are signal wiring patterns for transmitting and receiving various signals. The wiring patterns shown in FIG. 3 correspond to the wiring patterns shown in FIG. 2. A ground line wiring pattern 29g1 is formed over a whole surface between the second and third insulating films 25b and 25c. In this case, the ground line wiring pattern 29g1 is electrically connected to each of the ground line wiring patterns 29g between the first and second insulating films 25a and 25b through a viahole (shown by a broken line). The ground line wiring pattern 29g1 is not formed at the positions corresponding to viaholes for the signal line wiring patterns and power supply line wiring patterns 29d in FIG. 2, i.e., has free space portions for them. Thus, viahole wiring patterns 29v1 for the signal line wiring patterns and viahole wiring patterns 29v2 for power supply line wiring patterns are exposed on the insulating film 25b on the side of third insulating film 25c.

In this manner, the number of electrode pads between the second and third insulating films 25b and 25c can be reduced as compared with the number of electrode pads between the first and second insulating film 25a and 25b.

Further, if another insulating film is added and an electrode wiring pattern is formed between the third insulating film 25c and the added insulating film in the same manner as in FIG. 3, the number of electrode pads which are necessary for the power supply line wiring patterns can be also reduced. Therefore, the number of bumps which are protruded from the third insulating film 25c can be remarkably reduced. As shown in FIG. 3, further, by allowing the ground line wiring pattern 29g1 to be included, a shield effect for electromagnetically shielding the semiconductor chip 21 can be also provided.

As will be also obviously understood from the above description, according to the semiconductor package 20 in the first embodiment of the present invention, by employing the insulating film having a multi-layer structure, the number of bumps projecting from the semiconductor package 20 can be reduced over the number of electrode pads on the semiconductor chip 21, even if the number of electrode pads of the semiconductor chip 21 increases. Also, it is possible to have the formation of a multi-pin structure of the semiconductor chip 20. Further, since the necessary wiring patterns can be distributed on a plurality of insulating films, a degree of freedom of the design of the wiring patterns can be afforded, so that a wiring density can be reduced.

Figure 4:
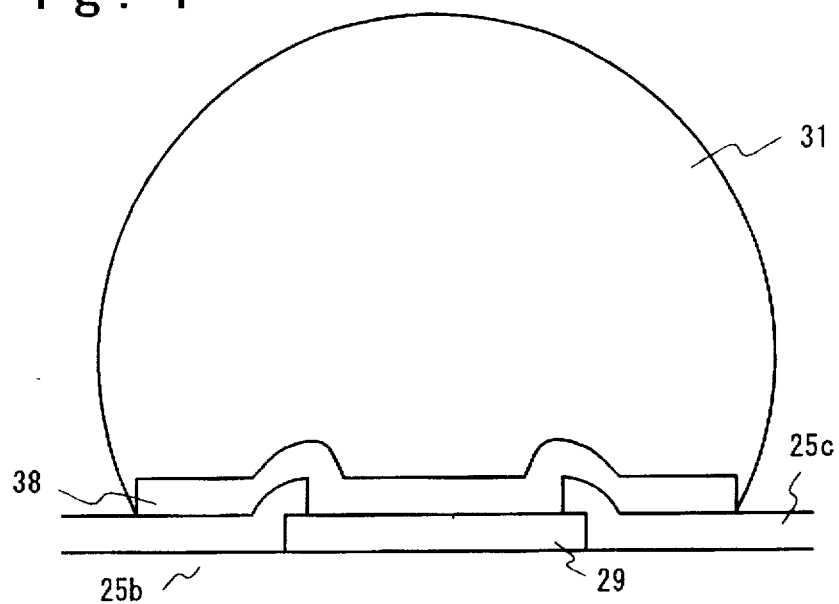
FIG. 4 is a cross sectional view of the structure of a solder bump in a semiconductor device according to a second embodiment of the invention.

Next, the semiconductor package according to the second embodiment of the present invention will be described below. In the embodiment, the break of bumps can be prevented. FIG. 4 is a cross sectional view of a semiconductor package according to the second embodiment to show the structure of the bumps which are formed on the package. Referring to FIG. 4, an electrode pad 29 made of copper or the like is formed on the outer surface of the insulating film 25b. The electrode pad 29 is partially covered by the third insulating film or an insulating cover coating 25c in a peripheral portion. In the case where a bump is directly attached onto the electrode pad 29, the diameter of the bump decreases in a connecting portion with the electrode pad 29, so that the bump is broken in the connecting portion with the electrode pad 29. In the second embodiment, first, by selectively eliminating the cover coating 25c, a center portion of the electrode pad 29 is exposed and, thereafter, a resist is coated. Subsequently, by partially eliminating the resist, the electrode pad 29 and the cover coating 25c around the electrode pad 29 are partially exposed. The resist eliminated region has an area that is wider than an originally exposed region of the electrode pad 29. Specifically speaking, if a diameter of electrode pad 29 is equal to 80 μm, it is desirable that a diameter of resist eliminated region lies within a range from 200 to 300 μm.

An underlayer 38 made of copper is coated onto the resist eliminated region by an electrolytic plating or evaporation deposition. Thereafter, the resist is removed and the necessary processes are performed. Finally, a solder bump 31 is formed. In the method, a solder block is put on the underlayer 38 and is heated and melted and the ball-shaped solder bump 31 is formed by a surface tension. The solder bump 31 is formed by tin or lead and has a diameter of 200 to 300 μm and a height of 100 to 250 μm.

As will be also obviously understood from the above description, according to the second embodiment, a land for the solder bump 31 is enlarged by the underlayer 38.

Another example of bump structure of a semiconductor package according to the second embodiment of the invention will be further described with reference to FIG. 5. According to the bump structure shown in FIG. 5, the electrode pad 29 whose periphery is partially covered by the cover coating 25c is provided on the outer surface of the insulating film 25b forming a part of the semiconductor package in a manner similar to the example of FIG. 4. The example shown in FIG. 5 differs from that shown in FIG. 4 in that the underlayer 38' of copper has a semi-spherical shape. Such a semi-spherical underlayer 38' can be also easily formed by an electrolytic plating. In a manner similar to the case of FIG. 4, the solder bump 31 of tin or lead is formed on the semi-spherical underlayer 38' by the method of heating and melting a solder block.

Figure 5:
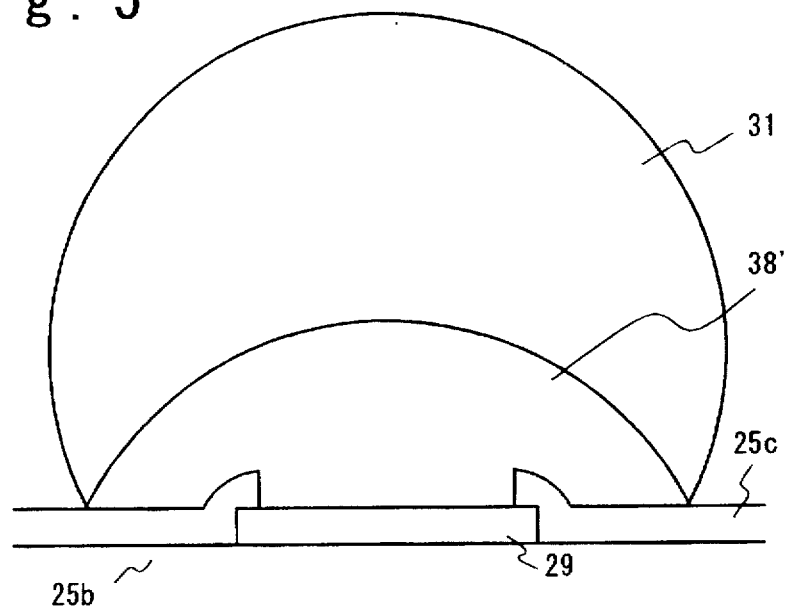
FIG. 5 is a cross sectional view of the structure of a solder bump as an example of a modification of the embodiment of FIG. 4.

In the embodiments shown in FIGS. 4 and 5, since the contact surface of the solder bump 31 and electrode pad 29 can be substantially enlarged, a situation such that the solder bump 31 is broken by a temperature cycle test of the semiconductor package could be prevented. Therefore, an anti-temperature cycle performance of the semiconductor package could be improved. Further, there is also an advantage such that when a pitch of the solder bumps 31 is set to 500 μm, a diameter of the solder bump 31 can be freely selected in a range of 100 to 300 μm. The examples of FIGS. 4 and 5 are particularly suitable for a semiconductor device which is installed onto the printed circuit board using the solder bump 31 but is not sealed with a resin.

Figure 6A:
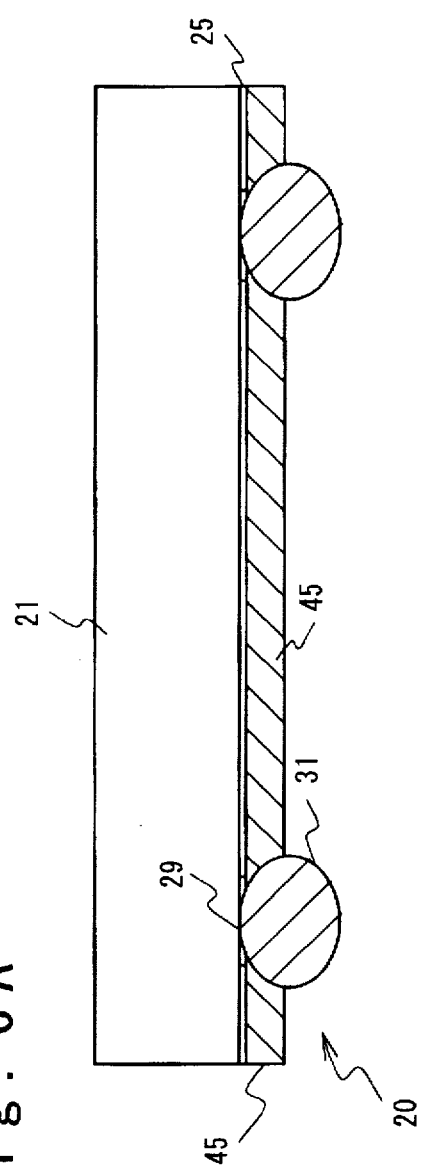
FIG. 6A is a cross sectional view showing a semiconductor device according to a third embodiment of the invention.
Figure 6B:
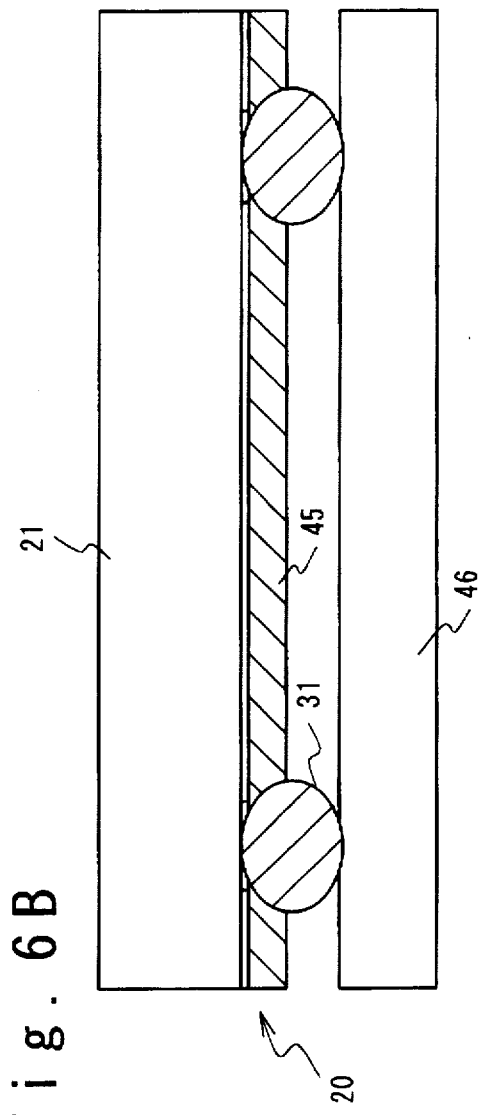
FIG. 6B is a cross sectional view showing the state when the semiconductor device is mounted on a print circuit board shown in FIG. 6A.

Next, a semiconductor device according to the third embodiment of the present invention and its installing method will now be described with reference to FIGS. 6A and 6B. The semiconductor device shown in the figures is constructed of the semiconductor chip 21, and the semiconductor package 20 which has substantially the same size as that of one surface of the semiconductor chip 21 and is attached onto the surface of the semiconductor chip 21 by an adhesive agent. The electrode pads 29 are formed on the semiconductor chip 21 and the semiconductor package 20 is composed of the insulating film 25 adhered to the surface of the semiconductor chip 21 by an adhesive agent. This embodiment is similar to the other embodiments in that the solder bumps 31 extending downward in the figure are attached to the electrode pads 29.

As mentioned above, it has been confirmed that when the solder bump 31 is merely directly attached to the electrode pad 29, a joint portion of the solder bump 31 is very weak against a stress. In the third embodiment, therefore, as shown in FIG. 6A, a resin layer 45 is coated to the joint portion of the solder bump 31, thereby reinforcing a joint intensity in the joint portion of the solder bump 31. As a resin used to form the resin layer 45, any one of a thermosetting resin and a thermoplastic resin can be used. According to the semiconductor device in which the joint portion with the electrode pad 29 is reinforced by the resin layer 45, as shown in FIG. 6B, in case of bonding the semiconductor device onto a printed circuit board 46, the solder bumps 40 are bonded to conductor layer patterns (not shown) on the printed circuit board 46 with a strong joint intensity and a breaking or the like of the solder bump 40 on the semiconductor package 20 side was not observed.

By using a thermoplastic resin which reflows from the heat and which forms the resin layer 45, by reflowing the resin layer 45 together with the solder bump 31 by heating the semiconductor device, the semiconductor package 20 can be mechanically removed from the solder bump 31. In case of the example shown in the figure, this is because the electrical connection and mechanical joint between the semiconductor package 20 and printed circuit board 46 are held by only the solder bumps 31. This means that after the semiconductor device is installed onto the printed circuit board 46, when a defect of the semiconductor chip 21 is detected, the semiconductor chip 21 can be exchanged with a normal chip and the print circuit board can be repaired. This feature that the semiconductor chip can be exchanged and the print circuit board can be repaired is very effective as the number of semiconductor devices which are installed on the printed circuit board 46 increases. Subsequently, the semiconductor device is tested.

Figure 7:
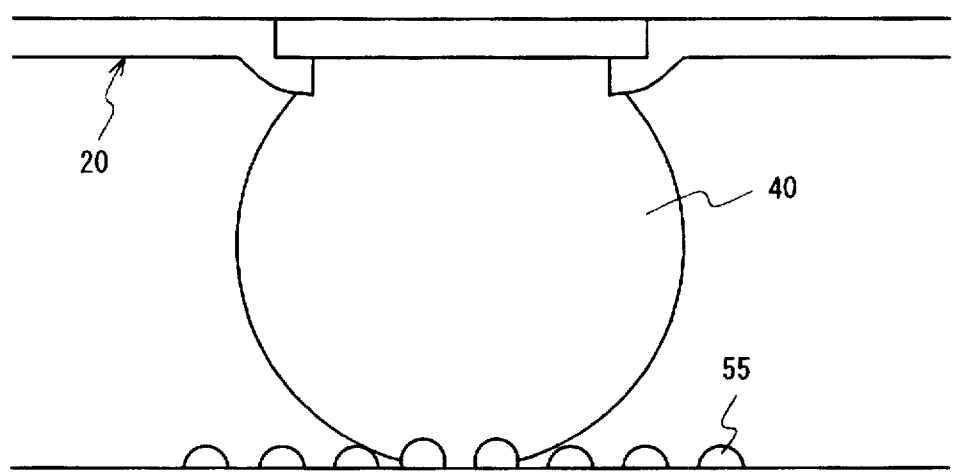
FIG. 7 is a diagram for explaining a probe for testing a semiconductor device according to a fifth embodiment of the invention.

Next, a testing probe for the solder bumps of the semiconductor device will be described. Referring now to FIG. 7, a probe for examining the solder bump according to another embodiment of the invention will be described. First, as mentioned above, the solder bumps 31 which are used in the semiconductor package have a diameter of 100 to 300 μm and are arranged at a pitch of 500 μm. Since the solder bump 31 itself is exposed into the atmosphere, it is in a state in which the surface is inevitably covered with a thin natural oxide film. To accurately measure characteristics of the semiconductor chip 21, therefore, a probe which can break the natural oxide film on the solder bump 31 and can be come into contact with the conductor portion of the solder bump 31 is necessary for testing.

For this purpose, although a probe having a pointed tip is generally used, when the size and pitch of the solder bumps 31 are small, it is difficult to accurately position the probe onto the solder bumps 31. In case of a probe having a flat tip, there is a drawback such that the natural oxide film on the solder bump cannot be broken, and an accurate measurement cannot be performed.

In consideration of the foregoing drawbacks, according to the embodiment, a probe in which a plurality of projecting electrodes 55 which are arranged at a pitch that is equal to or less than ⅓ of the diameter of the solder bump 31 are arranged on a straight line or in a crossing shape, is used as a probe for testing the solder bumps 31. Each projecting electrode 55 has a semi-spherical cross sectional shape. In case of testing the solder bumps 31 by using such a probe, since the projecting electrodes 55 are arranged in the probe at a pitch narrower than that of the solder bumps 31, when examining, three to five projecting electrodes 55 come into contact with a single solder bump 31. Therefore, conduction between the probe and the solder bump 31 is certainly performed and the solder bump 31 and projecting electrodes 55 come into contact with each other through points, so that the natural oxide film can be certainly broken. Since the projecting electrodes 55 of the probe are provided in a range wider than that of the solder bump 31, even if a positioning precision is low, the conduction between the projecting electrodes 55 and the solder bump 40 can be certainly obtained.

The semiconductor device after the test of solder bumps is installed on a printed circuit board is described as follows. FIGS. 8A to 8G illustrate the installing operation and exchanging operation of the semiconductor chip mentioned above. First, in a manner similar to FIG. 6A, the semiconductor device shown in FIG. 8A has the semiconductor chip 21, insulating film 25, solder bumps 31, and resin layer 45 coated on the peripheries of the solder bumps 31. In the embodiment, the resin layer 45 not only merely reinforces the solder bumps 31 but also functions as an adhesive material. The resin layer 45 is formed by a resin which has a high flowability in a state before curing and has an adhesive force in a temperature range of −40° to 125° C. in a state after the curing and whose adhesive force decreases at a melting temperature of the solder. As an example of such a resin, there is a resin of a thermoplastic polyimide system or fluorine system.

Figure 8A:
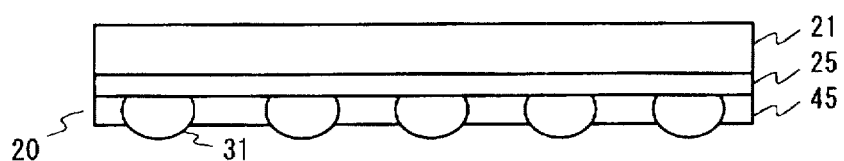
FIGS. 8A to 8F are diagrams for explaining an installing method of the semiconductor device according to a fourth embodiment of the invention.
Figure 8B:
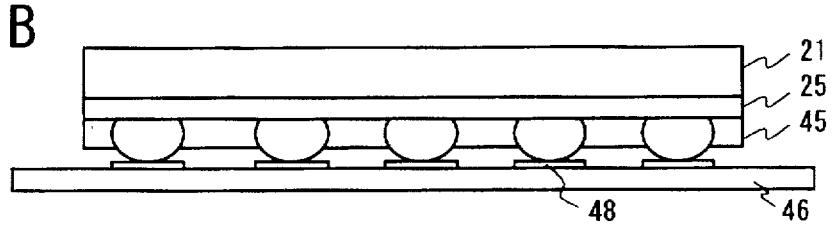

The semiconductor device shown in FIG. 8A is installed so that the solder bumps 31 are positioned onto conductor layers 48 on the printed circuit board 46 as shown in FIG. 8B. After that, the semiconductor device is heated to a temperature at which the solder melts and the adhesive force of the thermoplastic resin decreases. Thus, the solder bumps 31 are melted and bonded to the conductor layer patterns 48 on the printed circuit board 46. At the same time, the printed circuit board 46 and insulating film 25 are adhered by the thermoplastic resin 45. Namely, the bonding of the solder bumps 31 and the adhesion of the insulating film 25 can be simultaneously performed by the heating at one time.

Figure 8C:
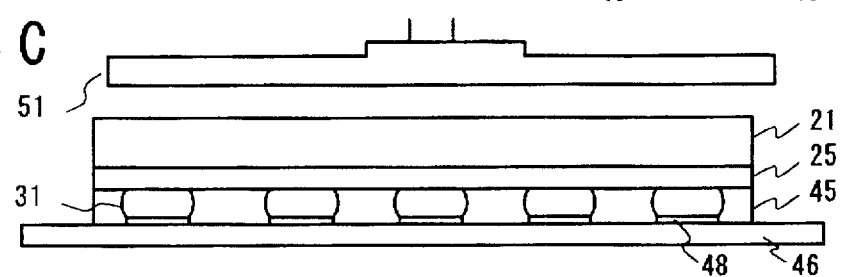
Figure 8D:
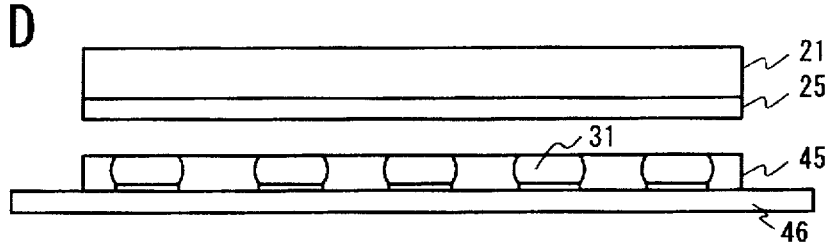

After that, when a defect of the semiconductor chip 21 is found in a state in which it is bonded onto the printed circuit board 46, as shown in FIG. 8C, a heating and sucking tool 51 is pushed on the back surface of the semiconductor chip 21 and heated to a temperature near the melting temperature of the solder bump 31. As a result of the heating, the resin layer 45 reflows so that an adhesive force with the insulating film 25 decreases, and an adhesive force of the solder bumps 31 with the semiconductor package also decrease. In this manner, as shown in FIG. 8D, the semiconductor chip 21 can be easily taken out from the solder bump 40 together with the insulating film 25. In this case, the resin is in the melted state and remains on the printed circuit board 46 side. Also, the solder bumps 31 remain on the printed circuit board 46 and a top portion of each solder bump 31 is exposed.

Figure 8E:
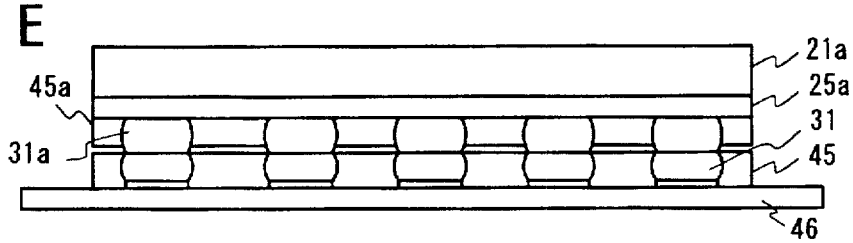
Figure 8F:
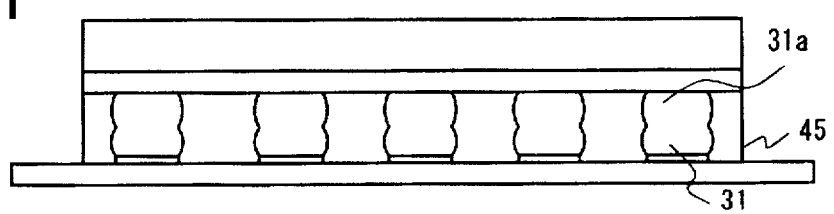

Subsequently, a new semiconductor device which has a construction similar to that of the semiconductor device shown in FIG. 8A is prepared as shown in FIG. 8E. In a manner similar to FIG. 8A, the new semiconductor device to be exchanged has a semiconductor chip 21, the insulating film 25, solder bumps 31, and a resin layer 45 coated so as to surround the solder bumps 31. In a manner similar to the resin layer 45, the resin layer 45 of the new semiconductor device is also formed by a resin which has a high flowability in a state before curing and has an adhesive force in a temperature range of −40° to 125° C. in a state after the curing and whose adhesive force decreases at the melting temperature of the solder.

As shown in FIG. 8E, the solder bumps 31 of the new semiconductor device to be exchanged is put onto the solder bumps 31 remaining on the printed circuit board 46 and is heated in this state. By the heating, the solder bumps 40 and resin layers 45 reflow and are integrated. As mentioned above, in the embodiment, there is an advantage in that after the semiconductor device was mounted onto the printed circuit board 46, even if a defect is found in the semiconductor chip 21 at the time of the shipping test or while the user is using the semiconductor device, the defective semiconductor device can be exchanged for the good semiconductor chip 21. In other words, by selecting the material of the resin layers 45 in consideration of the relation with the melting temperature of the solder bump, the semiconductor chip can be repaired.

According to the invention, a semiconductor package which can handle an increase in electrode pads of the semiconductor chip is derived, and the semiconductor device and its installing method which can prevent a breaking or the like on the semiconductor package side of the solder bump when the semiconductor device is installed onto the printed circuit board can be obtained. The semiconductor device and its installation method which can repair the defective semiconductor chip after completion of the installation, can also be obtained. The probe which can certainly perform the conduction test of the solder bump, is also obtained. According to the invention as mentioned above, there is an advantage such that all of the various problems in association with the solder bump of the semiconductor package can be solved.

It is contemplated that numerous modifications and alternatives may be devised by those skilled in the art without departing from the spirit and scope of the invention as defined in the following claims.

What is claimed is:

1. A semiconductor device comprising:
  a semiconductor chip having electrode pads, a surface of said semiconductor chip excluding said electrode pads being covered by a chip insulating film;
  a package composed of a plurality of multilayered insulating films including a first insulating film disposed nearest said electrode pads, and a second insulating film disposed farthest away from said electrode pads;
  a plurality of electrically conductive protrusions formed on said second insulating film; and
  wherein said plurality of multilayered insulating films are adhered to said semiconductor chip by an adhesive agent, said adhesive agent being disposed between said first insulating film and said chip insulating film; and
  wherein said package includes wiring patterns interposed between said plurality of multilayered insulating films, and said wiring patterns are selectively connected via viaholes to said electrode pads and said wiring patterns are selectively connected via viaholes to said plurality of electrically conductive protrusions formed on said second insulating film;
  said plurality of electrically conductive protrusions extending from a wiring pattern through viaholes provided in said second insulating film.

2. A semiconductor device according to claim 1, wherein said package has substantially a same surface area as a surface area of said semiconductor chip.

3. A semiconductor device according to claim 1, wherein at least one wiring pattern includes a ground line wiring pattern extending over an entire surface of a third insulating film disposed between adjacent first and second insulating films of said plurality of multilayered insulating films, except at positions corresponding to viahole wiring patterns disposed on said second insulating film.

4. A semiconductor device according to claim 1, further comprising extended land portions disposed on said second insulating film, from which said plurality of conductive protrusions extend.

5. A semiconductor device according to claim 4, wherein each of said extended land portions is greater in cross-sectional area than a corresponding cross-sectional area of each of said viaholes provided in said second insulating film.

6. A semiconductor device according to claim 4, wherein each of said extended land portions has a semi-spherical shape.

7. A semiconductor device according to claim 1, further comprising a resin layer surrounding said plurality of conductive protrusions and covering said second insulating film.

8. A semiconductor device according to claim 7, wherein said resin layer has an adhesive property such that said semiconductor device adheres to another device.

9. A semiconductor device according to claim 7, wherein a material of said resin layer has a melting point equal to or higher than that of said plurality of conductive protrusions.

10. A semiconductor device comprising:
  a semiconductor chip having electrode pads, a surface of said semiconductor chip excluding said electrode pads being covered by a chip insulating film;
  a package composed of a plurality of multilayered insulating films including a first insulating film disposed nearest said electrode pads, and a second insulating film disposed farthest away from said electrode pads; and
  a plurality of electrically conductive protrusions formed on the second insulating film;
  wherein said plurality of multilayered insulating films are adhered to said semiconductor chip by an adhesive agent, said adhesive agent being disposed between the first insulating film and the chip insulating film; and
  wherein said package includes wiring patterns interposed between said plurality of multilayered insulating films and extended land portions disposed on the second insulating film, and said wiring patterns are selectively connected via viaholes to said electrode pads and said wiring patterns are selectively connected via viaholes to said plurality of electrically conductive protrusions formed on the second insulating film;

said plurality of electrically conductive protrusions extending from a wiring pattern through viaholes provided in the second insulating film.

11. A semiconductor device according to claim 10, wherein at least one wiring pattern includes a ground line wiring pattern extending over an entire surface of a third insulating film disposed between adjacent first and second insulating films of said plurality of multilayered insulating films, except at positions corresponding to viahole wiring patterns disposed on the second insulating film.

12. A semiconductor device according to claim 11, wherein each of said extended land portions is greater in cross-sectional area than a corresponding cross-sectional area of each of said viaholes provided in the second insulating film.

13. A semiconductor device according to claim 12, wherein each of said extended land portions has a semispherical shape.

14. A semiconductor device according to claim 10, further comprising a resin layer surrounding said plurality of conductive protrusions and covering the second insulating film.

15. A semiconductor device according to claim 14, wherein said resin layer has an adhesive property such that said semiconductor device adheres to another device.

16. A semiconductor device according to claim 14, wherein a material of said resin layer has a melting point equal to or higher than that of said plurality of protrusions.

* * * * *